US009508763B2

(12) United States Patent
Yamamura

(10) Patent No.: US 9,508,763 B2
(45) Date of Patent: Nov. 29, 2016

(54) RADIATION DETECTOR

(75) Inventor: Kazuhisa Yamamura, Hamamatsu (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 14/346,768

(22) PCT Filed: Aug. 6, 2012

(86) PCT No.: PCT/JP2012/070003
§ 371 (c)(1),
(2), (4) Date: Mar. 24, 2014

(87) PCT Pub. No.: WO2013/046931
PCT Pub. Date: Apr. 4, 2013

(65) Prior Publication Data
US 2014/0239429 A1    Aug. 28, 2014

(30) Foreign Application Priority Data

Sep. 28, 2011   (JP) ................. 2011-212907

(51) Int. Cl.
*H01L 27/15*   (2006.01)
*H01L 27/00*   (2006.01)
(Continued)

(52) U.S. Cl.
CPC ....... *H01L 27/1446* (2013.01); *H01L 27/1443* (2013.01); *H01L 27/14603* (2013.01); *H01L 31/115* (2013.01)

(58) Field of Classification Search
CPC .......... H01L 27/14603; H01L 27/14643; H01L 27/1446; H01L 27/1464; H01L 27/14658; H01L 21/67115; H01L 27/14636; H01L 27/14661; H01L 27/14663; H01L 27/302; H01L 31/101; H01L 31/167

USPC ................................. 257/425–435
See application file for complete search history.

(56) References Cited

U.S. PATENT DOCUMENTS 7,256,830 B2 *  8/2007  Shizukuishi ...... H01L 27/14627
                                                     257/E27.152
8,599,364 B2 * 12/2013  Mase .................... G01S 17/89
                                                     356/213
(Continued)

FOREIGN PATENT DOCUMENTS

JP   S58-118143 A    7/1983
JP   H2-297977      12/1990
(Continued)

OTHER PUBLICATIONS

English-language translation of International Preliminary Report on Patentability (IPRP) dated Apr. 10, 2014 that issued in WO Patent Application No. PCT/JP2012/070003.

Primary Examiner — Marcos D Pizarro Crespo
Assistant Examiner — Nelson Garces
(74) Attorney, Agent, or Firm — Drinker Biddle & Reath LLP

(57) ABSTRACT

A radiation detector has a semiconductor substrate of a first conductivity type, a plurality of semiconductor regions of a second conductivity type making junctions with the semiconductor substrate, and a plurality of electrodes joined to the corresponding semiconductor regions. The electrodes cover the corresponding semiconductor regions, when viewed from a direction perpendicular to a first principal face. The semiconductor regions include a plurality of first and second semiconductor regions in a two-dimensionally array. The first semiconductor regions arrayed in a first direction in the two dimensional array out of the plurality of first semiconductor regions are electrically connected to each other, and the second semiconductor regions arrayed in a second direction intersecting with the first direction out of the plurality of second semiconductor regions are electrically connected to each other.

8 Claims, 12 Drawing Sheets

(51) Int. Cl.
*H01L 27/146* (2006.01)
*H01L 31/062* (2012.01)
*H01L 27/144* (2006.01)
*H01L 31/115* (2006.01)

(56) References Cited

U.S. PATENT DOCUMENTS

| | | | |
|---|---|---|---|
| 2002/0024071 A1* | 2/2002 | Kawajiri | H01L 27/14609 257/292 |
| 2003/0034496 A1* | 2/2003 | Yoneta | H01L 31/103 257/79 |
| 2003/0222200 A1* | 12/2003 | Skurnik | H01L 21/82380 250/208.1 |
| 2005/0212002 A1 | 9/2005 | Sanga et al. | |
| 2006/0017061 A1 | 1/2006 | Sakamoto et al. | |
| 2008/0197353 A1 | 8/2008 | Takahashi et al. | |
| 2010/0295143 A1* | 11/2010 | Yokogawa | H01L 27/14625 257/435 |
| 2013/0126998 A1* | 5/2013 | Shahar | H01L 31/085 257/428 |
| 2013/0126999 A1* | 5/2013 | Rusian | H01L 31/085 257/428 |
| 2013/0270666 A1* | 10/2013 | Sato | H01L 27/1446 257/438 |

FOREIGN PATENT DOCUMENTS

| | | |
|---|---|---|
| JP | H3-042878 | 2/1991 |
| JP | H11-54782 A | 2/1999 |
| JP | 2000-161911 | 6/2000 |
| JP | 2001-291853 A | 10/2001 |
| JP | 2002-164527 A | 6/2002 |
| JP | 2005-191136 A | 7/2005 |
| TW | 200504898 | 2/2005 |

* cited by examiner

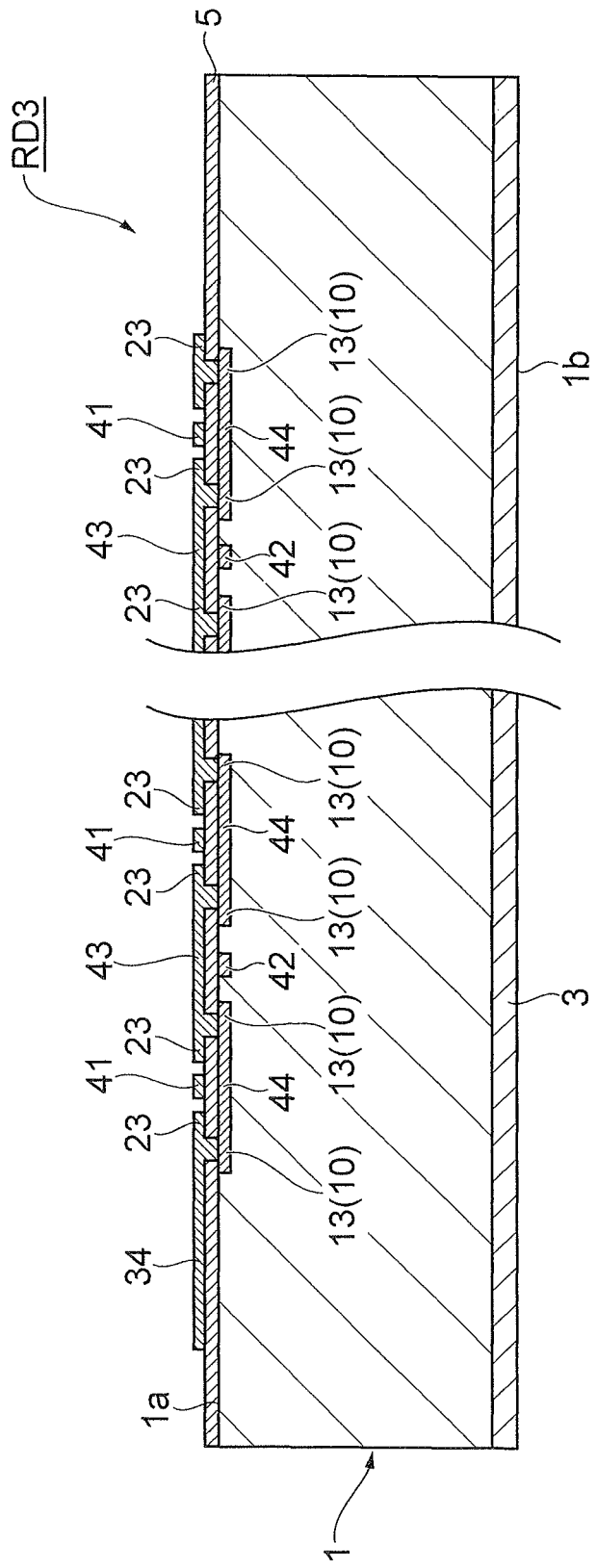

RADIATION DETECTOR

TECHNICAL FIELD

The present invention relates to a radiation detector.

BACKGROUND ART

A known radiation detector for two-dimensionally detecting an incident position of radiation is one having a semiconductor substrate of a first conductivity type having first and second principal faces opposed to each other and generating carriers in response to incidence of radiation, a plurality of semiconductor regions of a second conductivity type which are arranged along a position detection direction on the first principal face side of the semiconductor substrate and into which the generated carriers flow, and a plurality of semiconductor regions of the first conductivity type which are arranged along a direction perpendicular to the position detection direction on the second principal face side of the semiconductor substrate and into which the generated carriers flow (e.g., cf. Patent Literature 1).

CITATION LIST

Patent Literature

Patent Literature 1: Japanese Patent Application Laid-Open Publication No. 11-054782

SUMMARY OF INVENTION

Technical Problem

When radiation is incident into the radiation detector described in Patent Literature 1, carriers are generated in the semiconductor substrate. Some of the generated carriers flow into the semiconductor region of the second conductivity type in the vicinity of their generation position and the other of the generated carriers flow into the semiconductor region of the first conductivity type in the vicinity of the generation position. Therefore, the carriers are output from the semiconductor region of the second conductivity type and the semiconductor region of the first conductivity type at the position according to the incident position of radiation. In the radiation detector described in Patent Literature 1, the semiconductor regions into which the carriers used in position detection flow are arranged on the two principal faces of the semiconductor substrate. For this reason, it is necessary to form electrodes, interconnections, and others for readout of carriers from the respective semiconductor regions on the two principal face sides, which may cause the problem that the configuration of the radiation detector becomes complicated and is low in manufacturability, resulting in high cost.

It is an object of the present invention to provide a radiation detector capable of two-dimensionally detecting the incident position of radiation, while being constructed in a configuration wherein the semiconductor regions into which the carriers generated in the semiconductor substrate flow are arranged on one principal face side of the semiconductor substrate.

Solution to Problem

The present invention provides a radiation detector comprising: a semiconductor substrate of a first conductivity type having first and second principal faces opposed to each other and generating carriers in response to incidence of radiation; a plurality of semiconductor regions of a second conductivity type which are two-dimensionally arrayed on the first principal face side of the semiconductor substrate, which make junctions with the semiconductor substrate, and into which carriers generated into the semiconductor substrate flow; and a plurality of electrodes arranged corresponding to the respective semiconductor regions of the second conductivity type on the first principal face side of the semiconductor substrate and joined to the corresponding semiconductor regions of the second conductivity type, wherein, when viewed from a direction perpendicular to the first principal face, the plurality of electrodes cover the respective semiconductor regions of the second conductivity type so that outer edges thereof are located outside outer edges of the corresponding semiconductor regions of the second conductivity type, wherein the plurality of semiconductor regions of the second conductivity type include a plurality of first semiconductor regions in a two-dimensional array and a plurality of second semiconductor regions in a two-dimensional array, wherein the first semiconductor regions arrayed in a first direction in the two-dimensional array out of the plurality of first semiconductor regions are electrically connected to each other, and wherein the second semiconductor regions arrayed in a second direction intersecting with the first direction out of the plurality of second semiconductor regions are electrically connected to each other.

In the present invention, when radiation is incident into the radiation detector, carriers are generated in the semiconductor substrate. Some of the generated carriers flow into the semiconductor regions of the second conductivity type in the vicinity of their generation position. The plurality of semiconductor regions of the second conductivity type include the plurality of first semiconductor regions in the two-dimensional array and the plurality of second semiconductor regions in the two-dimensional array. Therefore, some of the generated carriers flow into the first semiconductor region and the second semiconductor region in the vicinity of the generation position. Since the first semiconductor regions arrayed in the first direction in the two-dimensional array are electrically connected to each other, the carriers flowing into the first semiconductor region are fed in the first direction to be output. This allows us to find out the incident position of radiation in the second direction. Since the second semiconductor regions arrayed in the second direction are electrically connected to each other, the carriers flowing into the second semiconductor region are fed in the second direction to be output. This allows us to find out the incident position of radiation in the first direction. In the present invention, as described above, the carriers flowing into the first semiconductor region are fed in the first direction and the carriers flowing into the second semiconductor region are fed in the second direction, thus enabling two-dimensional detection of the incident position of radiation.

In the present invention, when viewed from the direction perpendicular to the first principal face, the plurality of electrodes cover the respective semiconductor regions of the second conductivity type so that the outer edges of the electrodes are located outside the outer edges of the corresponding semiconductor regions of the second conductivity type. This can relieve concentration of an electric field in junction regions between the semiconductor substrate of the first conductivity type and the semiconductor regions of the second conductivity type and prevent carriers in the junction regions from leaking at their interfaces.

In the present invention, the radiation detector may be configured as follows: it further comprises: a plurality of first interconnections extending in the first direction and connecting the electrodes joined to the first semiconductor regions, to each other; and a plurality of second interconnections extending in the second direction and connecting the electrodes joined to the second semiconductor regions, to each other; the first semiconductor regions arrayed in the first direction are electrically connected to each other through the first interconnection; the second semiconductor regions arrayed in the second direction are electrically connected to each other through the second interconnection. In this case, the first semiconductor regions arrayed in the first direction are electrically connected to each other in a relatively low resistance and the second semiconductor regions arrayed in the second direction are electrically connected to each other in a relatively low resistance. This allows the radiation detector to be improved in response property.

In the present invention, the radiation detector may be configured as follows: the plurality of first interconnections have a width in the second direction smaller than a width in the second direction of the first semiconductor regions; the plurality of second interconnections have a width in the first direction smaller than a width in the first direction of the second semiconductor regions. In this case, it is feasible to readily achieve reduction in pitch of the array of first semiconductor regions and reduction in pitch of the array of second semiconductor regions.

In the present invention, the radiation detector may be configured as follows: central portions of regions where the first semiconductor regions and the electrodes are joined are included in regions where the first interconnections extend in the first direction; central portions of regions where the second semiconductor regions and the electrodes are joined are included in regions where the second interconnections extend in the second direction. In this case, electric connection paths become shorter between the first semiconductor regions arrayed in the first direction and electric connection paths become shorter between the second semiconductor regions arrayed in the second direction. This allows the radiation detector to be more improved in response property.

In the present invention, the radiation detector may be configured as follows: the electrodes joined to the first semiconductor regions, the electrodes joined to the second semiconductor regions, and the second interconnections are located in a first layer; the first interconnections are located in a second layer different from the first layer; the first interconnections and the second interconnections intersect in a three-dimensional manner. In this case, the first interconnections and the second interconnections extending in the directions intersecting with each other can be laid out without increase in length of the electric connection paths.

In the present invention, the radiation detector may be configured as follows: the first semiconductor regions and the second semiconductor regions have a circular shape when viewed from the direction perpendicular to the first principal face. In this case, it is feasible to readily achieve reduction in pitch of the array of first semiconductor regions and reduction in pitch of the array of second semiconductor regions and to improve the withstand voltage property.

In the present invention, the radiation detector may be configured as follows: the first semiconductor regions and the second semiconductor regions are alternately arrayed in a third direction intersecting with the first direction and the second direction. In this case, it is feasible to achieve further reduction in pitches of the arrays of first semiconductor regions and second semiconductor regions.

In the present invention, the radiation detector may be configured as follows: the plurality of first semiconductor regions have first and second parts of a circular shape when viewed from the direction perpendicular to the first principal face, and a third part extending in the first direction so as to couple the first part and the second part together; the plurality of second semiconductor regions have first and second parts of a circular shape when viewed from the direction perpendicular to the first principal face, and a third part extending in the second direction so as to couple the first part and the second part together. In this case, in the first and second semiconductor regions a depletion layer expands toward the second principal face, not only from the first and second parts of the circular shape but also from the third part. This allows the depletion layer with a sufficient thickness to be formed on a stable basis.

In the present invention, the radiation detector may be configured as follows: the first semiconductor regions and the second semiconductor regions are alternately arrayed in each of the first direction and the second direction. In this case, it is feasible to achieve further reduction in pitches of the arrays of first semiconductor regions and second semiconductor regions.

Advantageous Effect of Invention

The present invention successfully provides the radiation detector capable of two-dimensionally detecting the incident position of radiation, while being constructed in the configuration wherein the semiconductor regions into which carriers generated in the semiconductor substrate flow are arranged on one principal face side of the semiconductor substrate.

BRIEF DESCRIPTION OF DRAWINGS

FIG. 12 is a drawing for explaining a sectional configuration along the line XII-XII in FIG. 10.

DESCRIPTION OF EMBODIMENTS

Preferred Embodiments of the present invention will be described below in detail with reference to the accompanying drawings. The same elements or elements with the same functionality will be denoted by the same reference signs in the description, without redundant description.

Figure 1:
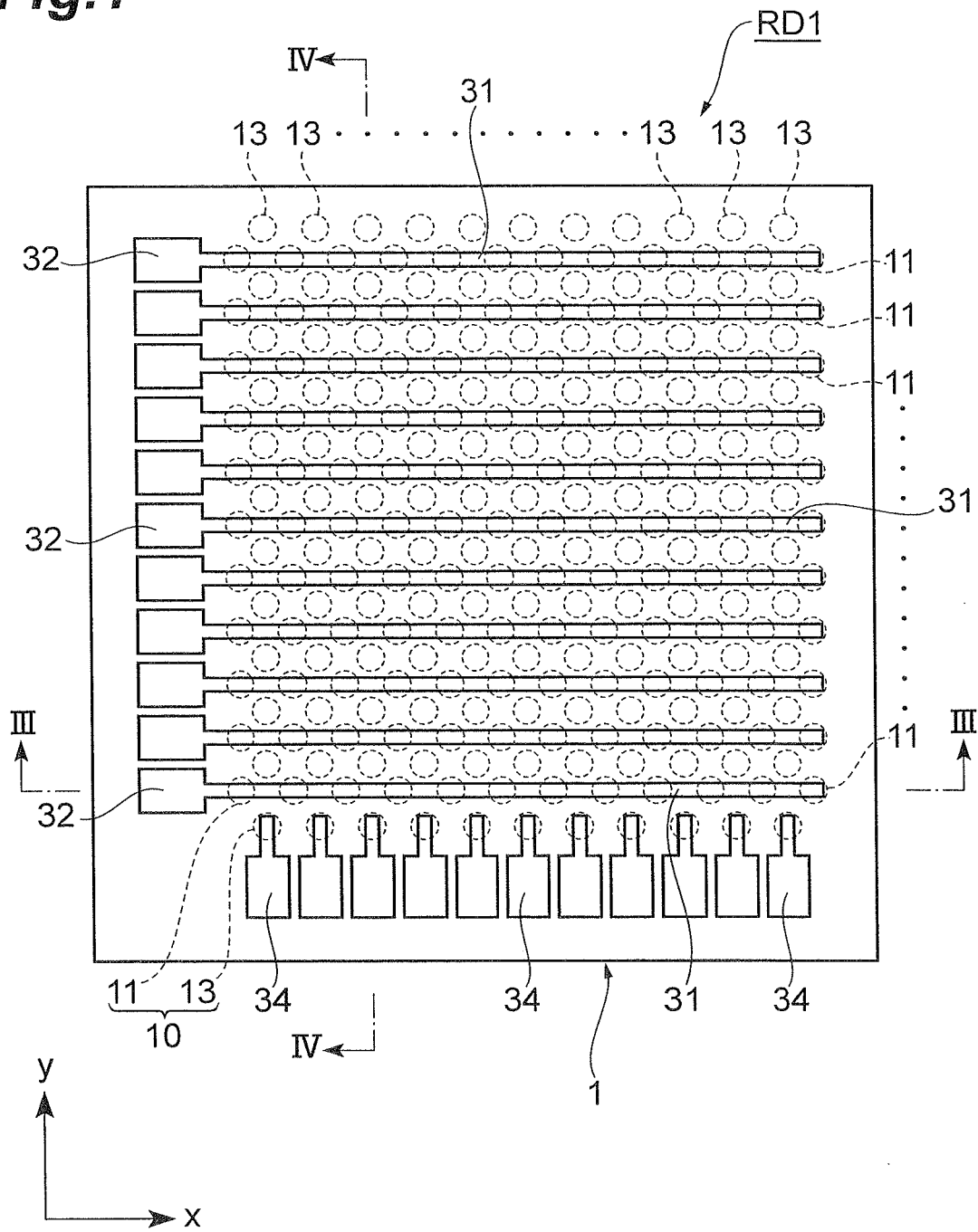
FIG. 1 is a plan view showing the radiation detector according to an embodiment of the present invention.
Figure 2:
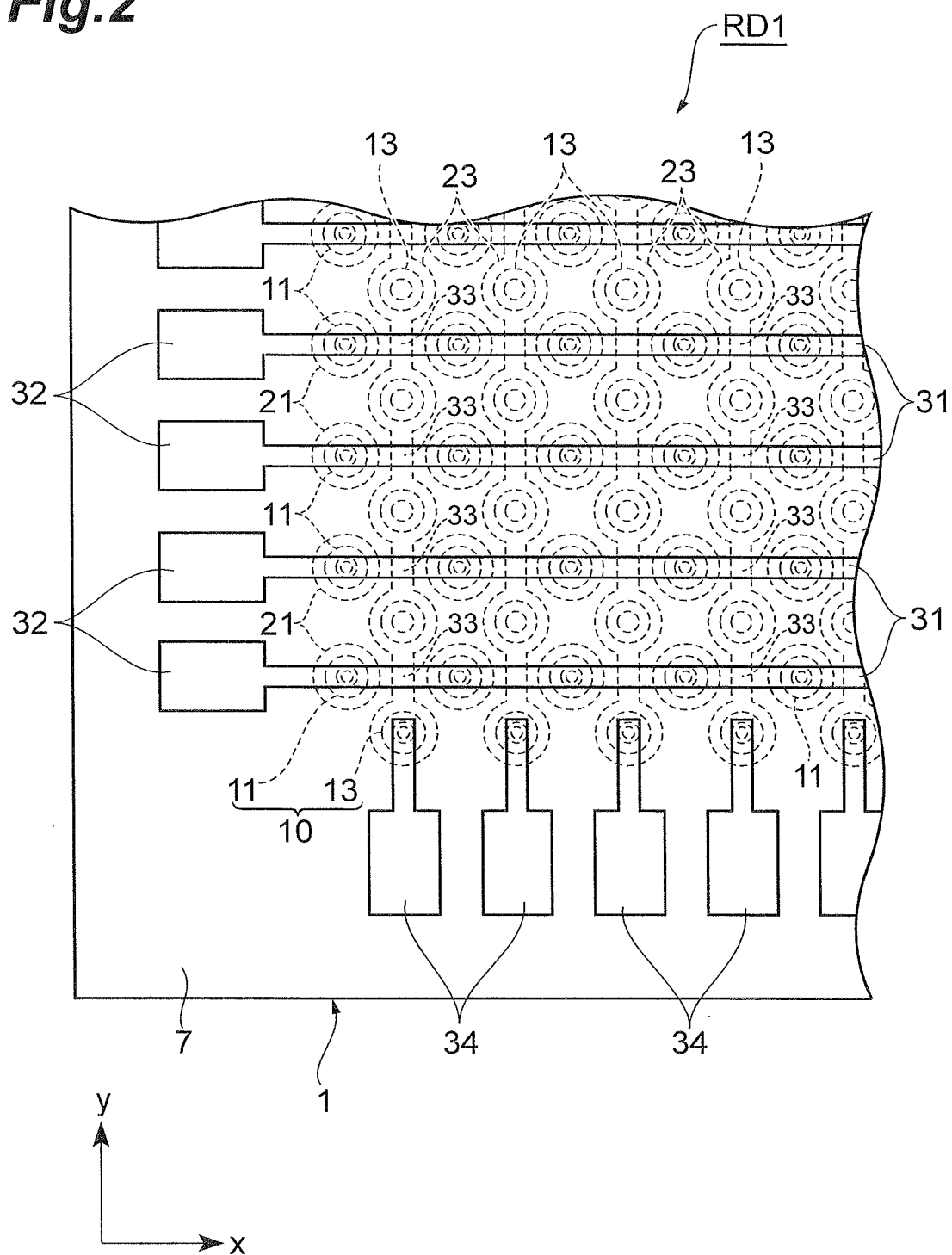
FIG. 2 is a plan view showing the radiation detector according to the present embodiment.
Figure 3:
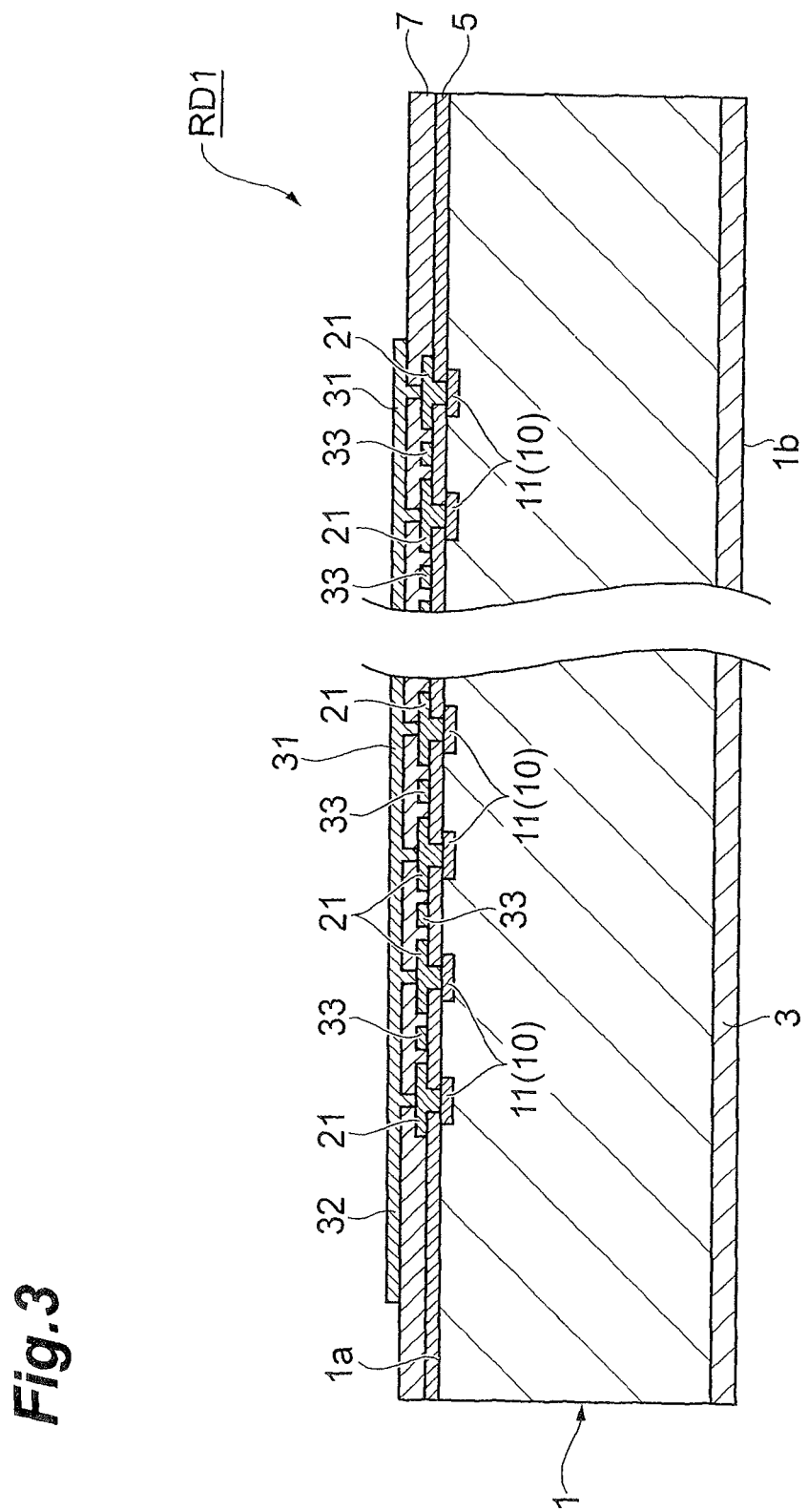
FIG. 3 is a drawing for explaining a sectional configuration along the line III-III in FIG. 1.
Figure 4:
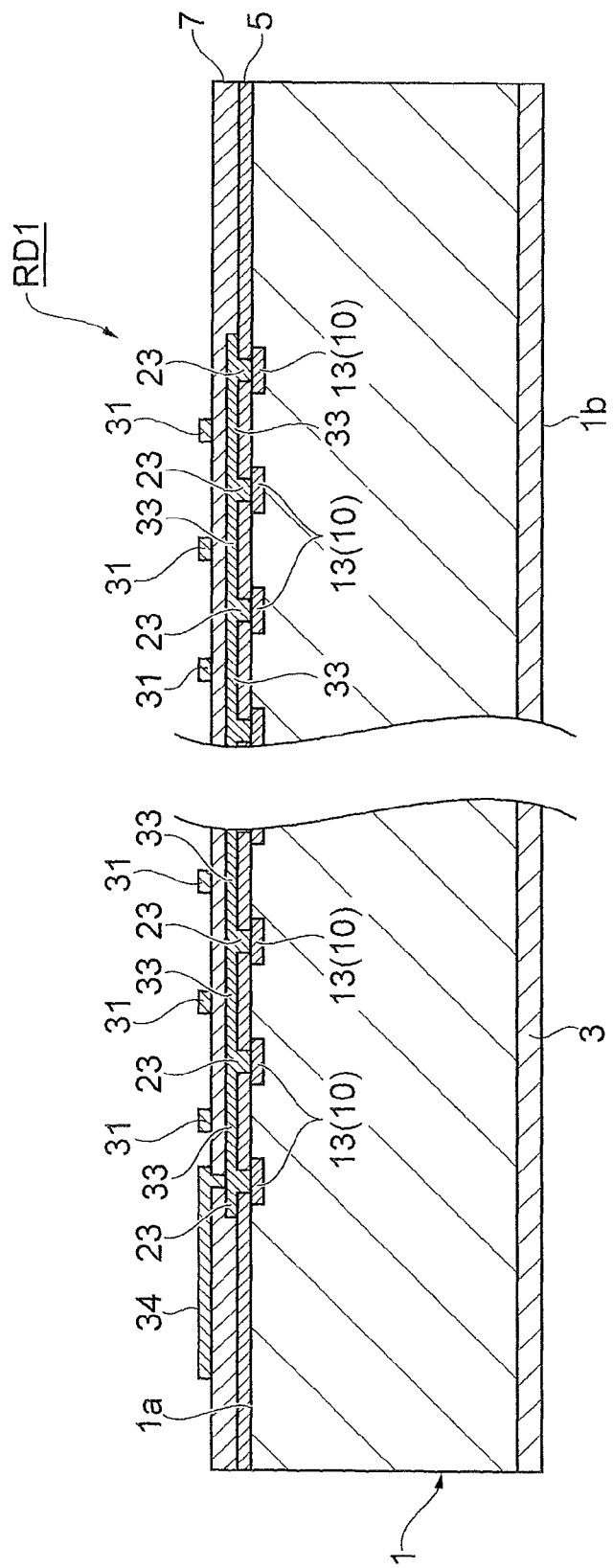
FIG. 4 is a drawing for explaining a sectional configuration along the line IV-IV in FIG. 1.

First, a configuration of the radiation detector RD1 according to the present embodiment will be described with reference to FIGS. 1 to 4. FIGS. 1 and 2 are plan views showing the radiation detector according to the present embodiment. FIG. 3 is a drawing for explaining a sectional configuration along the line III-III in FIG. 1. FIG. 4 is a drawing for explaining a sectional configuration along the line IV-IV in FIG. 1.

The radiation detector RD1 has a semiconductor substrate 1 with a first principal face 1a and a second principal face 1b opposed to each other. The semiconductor substrate 1 is a semiconductor substrate of a first conductivity type with a low impurity concentration (e.g., n⁻ type) and has a rectangular shape when viewed from a direction perpendicular to the first principal face 1a. The semiconductor substrate 1 generates carriers (electron-hole pairs) in response to incidence of radiation and functions as a radiation-sensitive region. The size of the semiconductor substrate 1 is, for example, 60×60 mm. The thickness of the semiconductor substrate 1 is, for example, from 100 to 1000 μm. The impurity concentration of the semiconductor substrate 1 is, for example, from $1\times10^{15}$ to $10^{21}$ cm$^{-3}$. The resistivity of the semiconductor substrate 1 is, for example, from 1 K to 20 KΩ·cm.

In the present embodiment, "high impurity concentration" refers, for example, to an impurity concentration of not less than about $1\times10^{15}$ cm$^{-3}$ and is represented by "+" attached to conductivity type. "Low impurity concentration" refers, for example, to an impurity concentration of not more than about $1\times10^{15}$ cm$^{-3}$ and is represented by "−" attached to conductivity type.

The radiation detector RD1 has a plurality of semiconductor regions (264 semiconductor regions in the present embodiment) 10 arranged on the first principal face 1a side of the semiconductor substrate 1. Each semiconductor region 10 is a semiconductor region of a second conductivity type with a high impurity concentration (e.g., p⁺ type). Each semiconductor region 10 is formed by diffusing a p-type impurity in a high concentration from the first principal face 1a side in the semiconductor substrate 1. The thickness of the semiconductor regions 10 is, for example, from 0.1 to 10 μm. The impurity concentration of the semiconductor regions 10 is, for example, from $1\times10^{15}$ to $10^{21}$ cm$^{-3}$.

The plurality of semiconductor regions 10 are two-dimensionally arrayed on the first principal face 1a side of the semiconductor substrate 1 and make junctions (pn junctions) with the semiconductor substrate 1. Carriers (holes in the present embodiment) generated in the semiconductor substrate 1 flow into each semiconductor region 10.

The plurality of semiconductor regions 10, as shown in FIG. 1, include a plurality of first semiconductor regions (132 first semiconductor regions in the present embodiment) 11 and a plurality of second semiconductor regions (132 second semiconductor regions in the present embodiment) 13. In FIG. 1, the semiconductor regions 10 (first and second semiconductor regions 11, 13) are indicated by dashed lines, for the purpose of illustration.

The plurality of first semiconductor regions 11 are two-dimensionally arrayed in a matrix of M rows in the y-axis direction (second direction) and N columns in the x-axis direction (first direction) (M and N are natural numbers) and in the present embodiment, they are arranged in an array of eleven rows in the second direction and twelve columns in the first direction. The plurality of second semiconductor regions 13 are also two-dimensionally arrayed in a matrix of M rows in the second direction and N columns in the first direction (M and N are natural numbers) and in the present embodiment, they are arranged in an array of twelve rows in the second direction and eleven columns in the first direction. The first semiconductor regions 11 and the second semiconductor regions 13 are alternately arrayed in a third direction intersecting with the first direction and the second direction. As described above, the first direction and the second direction intersect each other (the first direction and the second direction are perpendicular to each other in the present embodiment).

The first semiconductor regions 11 are arranged at the pitch, e.g., from 30 to 300 μm in the first direction and at the pitch, e.g., from 30 to 300 μm in the second direction. The second semiconductor regions 13 are arranged at the pitch, e.g., from 30 to 300 μm in the first direction and at the pitch, e.g., from 30 to 300 μm in the second direction. The pitch in the third direction of the first semiconductor regions 11 and the second semiconductor regions 13 is, for example, from 30 to 300 μm. Each of the first and second semiconductor regions 11, 13 is of a circular shape when viewed from the direction perpendicular to the first principal face 1a. The radius of each of the first and second semiconductor regions 11, 13 is, for example, from 10 to 145 μm.

The radiation detector RD1 has a semiconductor region 3 arranged on the second principal face 1b side of the semiconductor substrate 1. The semiconductor region 3 is a semiconductor region of the first conductivity type with a high impurity concentration (e.g., n⁺ type). The semiconductor region 3 is formed over the entire area of the second principal face 1b by diffusing an n-type impurity in a high concentration from the second principal face 1b side in the semiconductor substrate 1. The thickness of the semiconductor region 3 is, for example, from 0.1 to 10 μm. The impurity concentration of the semiconductor region 3 is, for example, from $1\times10^{15}$ to $10^{21}$ cm$^{-3}$.

The radiation detector RD1 has a plurality of electrodes 21, 23 arranged on the first principal face 1a side of the semiconductor substrate 1. Each of the electrodes 21, 23 is arranged through an insulating layer 5 on the first principal face 1a of the semiconductor substrate 1. Each electrode 21, 23 is comprised of metal (e.g., aluminum or the like). The insulating layer 5 is comprised, for example, of a silicon oxide film or the like.

The plurality of electrodes 21 are arranged corresponding to the respective first semiconductor regions 11 and are joined to the corresponding first semiconductor regions 11. Namely, each electrode 21 is connected in ohmic contact to the first semiconductor region 11 through a through-hole formed in the insulating layer 5. The electrode 21, when viewed from the direction perpendicular to the first principal face 1a, covers the first semiconductor region 11 so that the outer edge thereof is located outside the outer edge of the corresponding first semiconductor region 11. The electrode 21 is of a circular shape when viewed from the direction perpendicular to the first principal face 1a.

The plurality of electrodes 23 are arranged corresponding to the respective second semiconductor regions 13 and are joined to the corresponding second semiconductor regions 13. Namely, each electrode 23 is connected in ohmic contact to the second semiconductor region 13 through a through-hole formed in the insulating layer 5. The electrode 23, when viewed from the direction perpendicular to the first principal face 1a, covers the second semiconductor region 13 so that the outer edge thereof is located outside the outer edge of the corresponding second semiconductor region 13. The electrode 23 is of a circular shape when viewed from the direction perpendicular to the first principal face 1a.

The radiation detector RD1 has a plurality of first interconnections 31 and a plurality of second interconnections 33. The plurality of first interconnections 31 are arranged through an insulating layer 7 on the electrodes 21 and the insulating layer 5. The plurality of second interconnections 33 are arranged on the insulating layer 5. Namely, the electrodes 21, 23 and the second interconnections 33 are located in an identical first layer, while the first interconnections 31 are located in a second layer different from the foregoing first layer of the electrodes 21, 23 and the second interconnections 33. Each of the interconnections 31, 33 is comprised of metal (e.g., aluminum or the like). The insulating layer 7 is comprised, for example, of a silicon oxide film or the like. In the present embodiment, the electrodes 23 and the second interconnections 33 are integrally formed. An unshown insulating layer (e.g., comprised of a silicon oxide film or the like) is formed on the insulating layer 7 and the first interconnections 31.

The first interconnections 31 extend in the first direction over the first semiconductor regions 11 arrayed in the first direction (x-axis direction) out of the plurality of first semiconductor regions 11 and are joined to the electrodes 21 through the through-holes formed in the insulating layer 7. The first interconnections 31 connect the electrodes 21 joined to the first semiconductor regions 11 arrayed in the first direction. By this, the first semiconductor regions 11 arrayed in the first direction are electrically connected to each other through the electrodes 21 and the first interconnection 31.

Each first interconnection 31 has the width in the second direction set smaller than the width (diameter) in the second direction of the first semiconductor regions 11. The width in the second direction of the first interconnections 31 is, for example, from 5 to 20 μm. Central portions of regions where the first semiconductor regions 11 and the electrodes 21 are joined are included in regions where the first interconnections 31 extend in the first direction. Namely, the central portions of the regions where the first semiconductor regions 11 and the electrodes 21 are joined are covered by the first interconnections 31, when viewed from the direction perpendicular to the first principal face 1a.

At an end of each first interconnection 31, a pad electrode 32 for carrier readout is provided integrally with the first interconnection 31. The pad electrodes 32 are arranged in a line along the second direction. The pad electrodes 32 may be provided at both ends of each first interconnection 31. The pad electrodes 32 may be arranged in a zigzag pattern along the second direction.

The second interconnections 33 extend in the second direction (y-axis direction) between adjacent electrodes 21 and are connected to the electrodes 23. The second interconnections 33 connect the electrodes 23 joined to the second semiconductor regions 13 arrayed in the second direction. By this, the second semiconductor regions 13 arrayed in the second direction out of the plurality of second semiconductor regions 13 are electrically connected to each other through the electrodes 23 and the second interconnection 33.

Each second interconnection 33 has the width in the first direction set smaller than the width (diameter) in the first direction of the second semiconductor regions 13. The width in the first direction of the second interconnections 33 is, for example, from 5 to 20 μm. Central portions of regions where the second semiconductor regions 13 and the electrodes 23 are joined are included in regions where the second interconnections 33 extend in the second direction. The second interconnections 33 are located in the layer different from the first interconnections 31 and, the first interconnections 31 and the second interconnections 33 intersect in a three-dimensional manner.

Pad electrodes 34 for carrier readout are provided on the insulating layer 7. Namely, the pad electrodes 34 are provided at one ends of electric connection paths for the second semiconductor regions 13 arrayed in the second direction. The pad electrodes 34 are arranged in a line along the first direction. The pad electrodes 34 are joined to the electrodes 23 through the through-holes formed in the insulating layer 7. The pad electrodes 34 may be provided at both ends of the electric connection paths for the second semiconductor regions 13 arrayed in the second direction. The pad electrodes 34 may be arranged in a zigzag pattern along the first direction.

Figure 5:
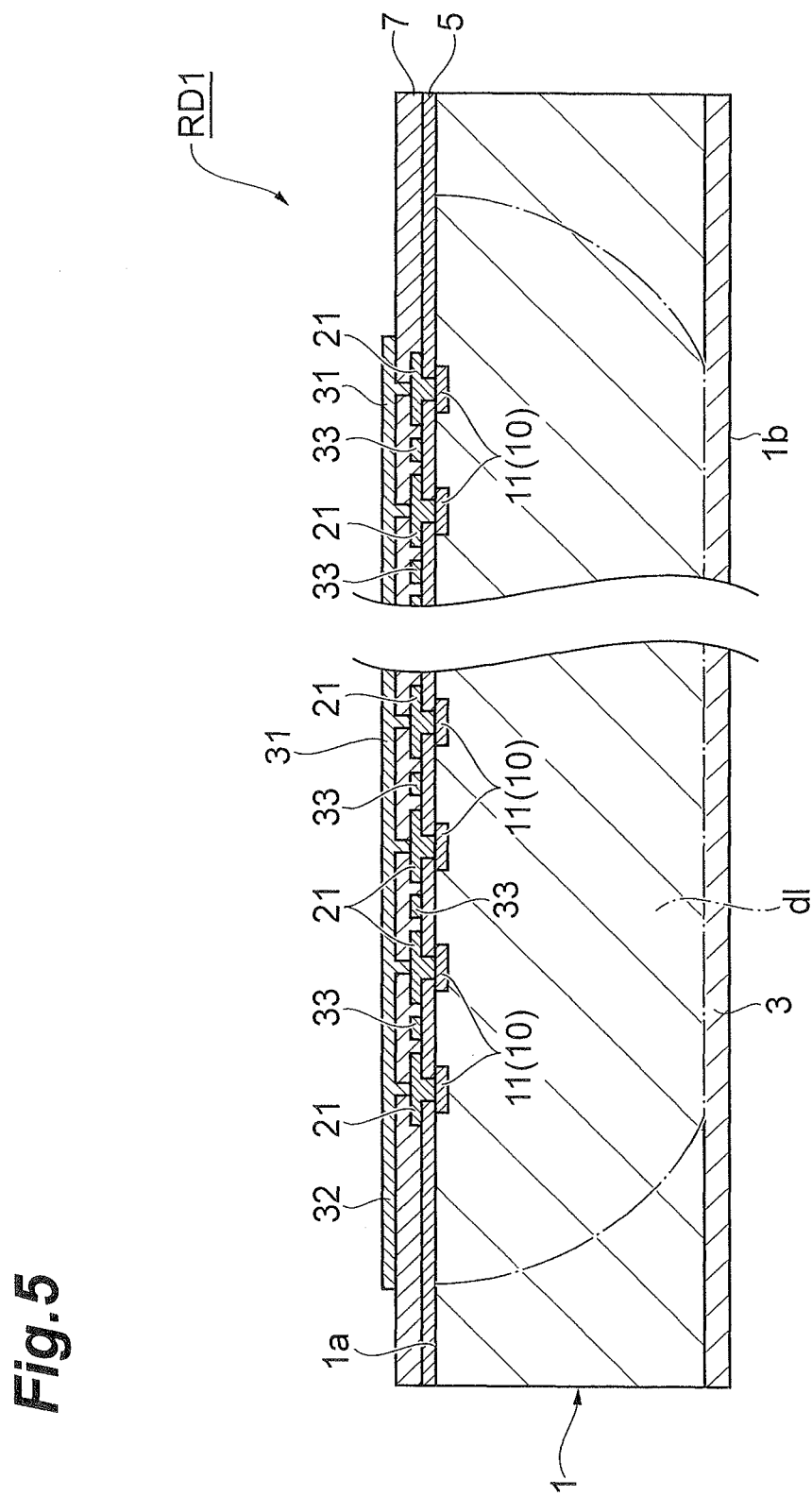
FIG. 5 is a drawing for explaining a sectional configuration of the radiation detector according to the present embodiment.
Figure 6:
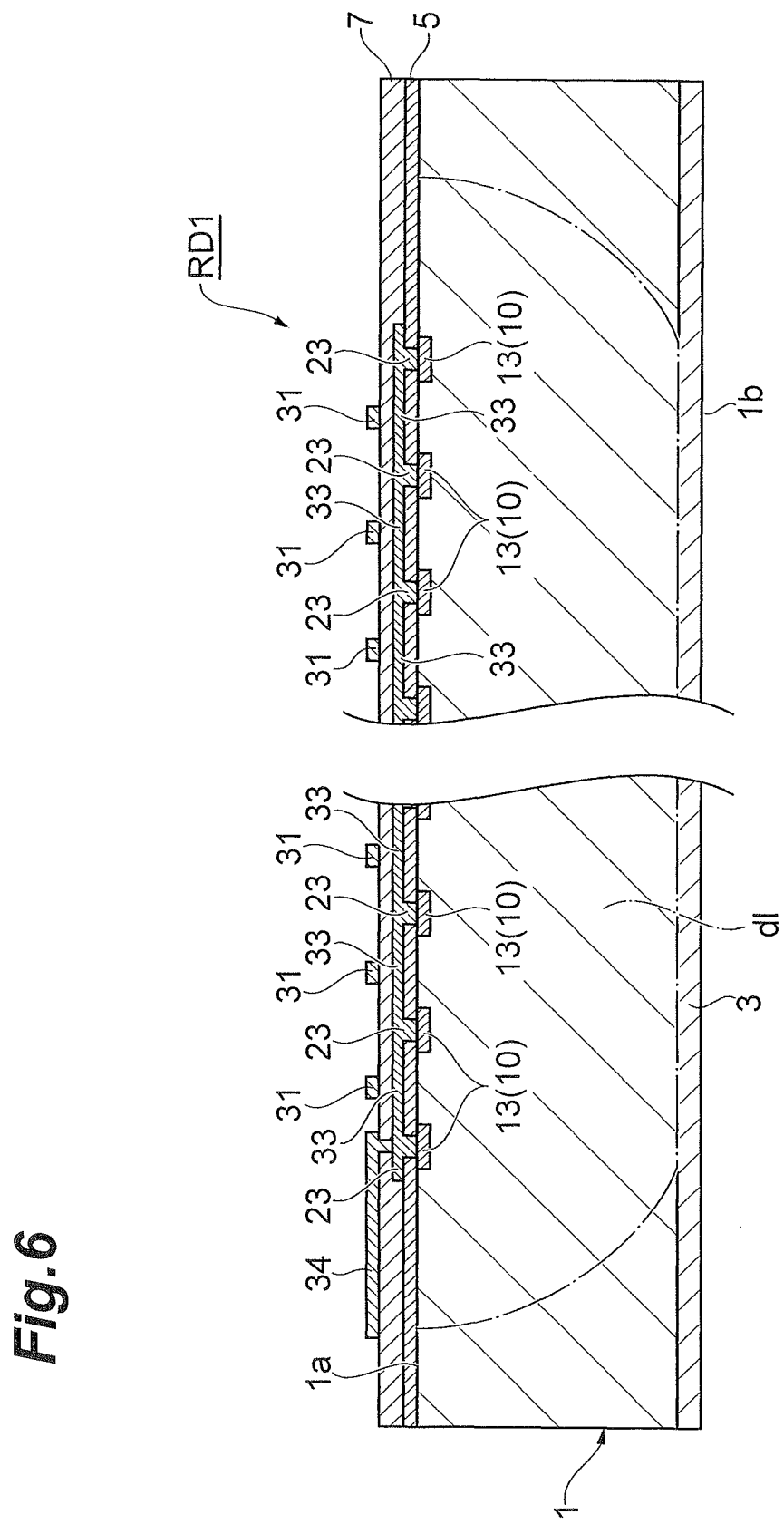
FIG. 6 is a drawing for explaining a sectional configuration of the radiation detector according to the present embodiment.

In the radiation detector RD1, when a reverse bias voltage is applied between the semiconductor regions 10 (first and second semiconductor regions 11, 13) and the semiconductor region 3, a depletion layer dl is formed according to the magnitude of the reverse bias voltage in the semiconductor substrate 1, as shown in FIGS. 5 and 6. In the radiation detector RD1, the semiconductor substrate 1 is brought into a completely depleted state in which the depletion layer dl reaches the semiconductor region 3.

When radiation is incident onto the radiation detector RD1 with the semiconductor substrate 1 being kept in the completely depleted state, carriers (electron-hole pairs) are generated in the semiconductor substrate 1. The generated carriers (holes) flow into the semiconductor regions 10 in the vicinity of their generation position. The semiconductor regions 10 include the plurality of first semiconductor regions 11 in the two-dimensional array and the plurality of second semiconductor regions 13 in the two-dimensional array. Therefore, the generated carriers (holes) flow into the first semiconductor region 11 and the second semiconductor region 13 in the vicinity of the generation position.

The first semiconductor regions 11 arrayed in the first direction are electrically connected to each other. The carriers flowing into the first semiconductor region 11 are fed in the first direction through the electrode 21 joined to the first semiconductor region 11 into which the carriers flow and through the first interconnection 31 joined to the electrode, and are output from the corresponding pad electrode 32. This allows us to find out the incident position of radiation in the second direction.

The second semiconductor regions 13 arrayed in the second direction are electrically connected to each other. The carriers flowing into the second semiconductor region 13 are fed in the second direction through the electrode 23 joined to the second semiconductor region 13 into which the carriers flow and through the second interconnection 33 joined to the electrode 23, and are output from the corresponding pad electrode 34. This allows us to find out the incident position of radiation in the first direction.

In the present embodiment, as described above, the carriers flowing into the first semiconductor region 11 in the vicinity of the generation position are fed in the first direction and the carriers flowing into the second semiconductor region 13 in the vicinity of the generation position are fed in the second direction. For this reason, the radiation detector RD1 can two-dimensionally detect the incident position of radiation.

In the radiation detector RD1, the plurality of electrodes 21, 23 cover the respective semiconductor regions 11, 13 so that the outer edges of the electrodes 21, 23 are located outside the outer edges of the the semiconductor regions 11, 13, when viewed from the direction perpendicular to the first principal face 1a. This relieves concentration of an electric field in a junction region between the semiconductor substrate 1 and each semiconductor region 11, 13, and thus can prevent carriers from leaking at a junction interface.

In the radiation detector RD1, the first semiconductor regions 11 arrayed in the first direction are electrically connected to each other through the first interconnection 31 and the second semiconductor regions 13 are electrically connected to each other through the second interconnection 33. By this, the first semiconductor regions 11 arrayed in the first direction are electrically connected to each other in a relatively low resistance and the second semiconductor regions 13 arrayed in the second direction are electrically connected to each other in a relatively low resistance. As a consequence of this, the radiation detector RD1 is improved in response property.

Each first interconnection 31 has the width in the second direction set smaller than the width in the second direction of the first semiconductor regions 11 and each second interconnection 33 has the width in the first direction set smaller than the width in the first direction of the second semiconductor regions 13. This allows easy achievement of reduction in pitch of the array of first semiconductor regions 11 and reduction in pitch of the array of second semiconductor regions 13.

In the radiation detector RD1, the generated carriers flow into the first semiconductor region 11 and the second semiconductor region 13 whereby the incident position of radiation can be two-dimensionally detected. If the generated carriers flow one-sidedly into the first semiconductor region 11 or one-sidedly into the second semiconductor region 13, it would be difficult to appropriately detect the incident position of radiation. Therefore, it is preferable to reduce the pitches of the arrays of the first semiconductor regions 11 and the second semiconductor regions 13.

In the radiation detector RD1, the central portions of the regions where the first semiconductor regions 11 and the electrodes 21 are joined are included in the regions where the first interconnections 31 extend in the first direction and the central portions of the regions where the second semiconductor regions 13 and the electrodes 23 are joined are included in the regions where the second interconnections 33 extend in the second direction. This decreases the electric connection paths for the first semiconductor regions 11 arrayed in the first direction and the electric connection paths for the second semiconductor regions 13 arrayed in the second direction. This can further improve the response property of the radiation detector RD1.

The electrodes 21, 23 and the second interconnections 33 are located in the first layer, the first interconnections 31 are located in the second layer different from the first layer, and the first interconnections 31 and the second interconnections 33 intersect in a three-dimensional manner. This allows the first interconnections 31 and the second interconnections 33 extending in the directions perpendicular to each other to be laid out without increase in length of the electric connection paths.

The first semiconductor regions 11 and the second semiconductor regions 13 have the circular shape when viewed from the direction perpendicular to the first principal face 1a. This makes it feasible to readily achieve reduction in pitch of the array of first semiconductor regions 11 and reduction in pitch of the array of second semiconductor regions 13 and to improve the withstand voltage property.

The first semiconductor regions 11 and the second semiconductor regions 13 are alternately arrayed in the third direction intersecting with the first direction and the second direction. This can achieve further reduction in the pitches of the arrays of the first semiconductor regions 11 and the second semiconductor regions 13.

In the radiation detector RD1, the number of first semiconductor regions 11 arrayed in the first direction (the number of columns of the first semiconductor regions 11) is set equal to the number of second semiconductor regions 13 arrayed in the second direction (the number of rows of the second semiconductor regions 13). The length of the electric connection paths for the first semiconductor regions 11 arrayed in the first direction is set approximately equal to the length of the electric connection paths for the second semiconductor regions 13 arrayed in the second direction. These make the response property in each column of the first semiconductor regions 11 and the response property in each row of the second semiconductor regions 13 approximately equal and thus allow more appropriate detection of the incident position of radiation.

Figure 7:
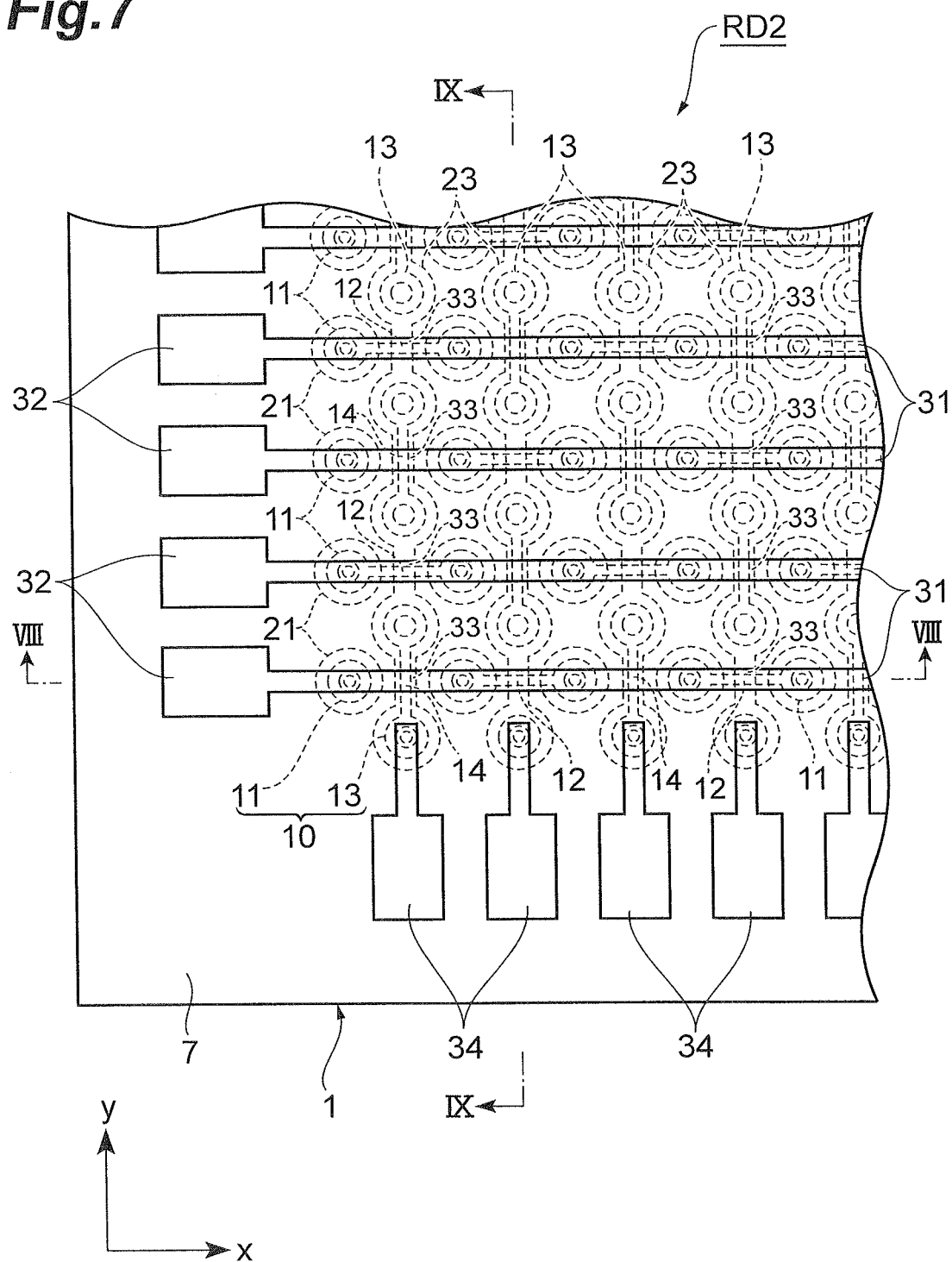
FIG. 7 is a plan view showing the radiation detector according to a modification example of the present embodiment.
Figure 8:
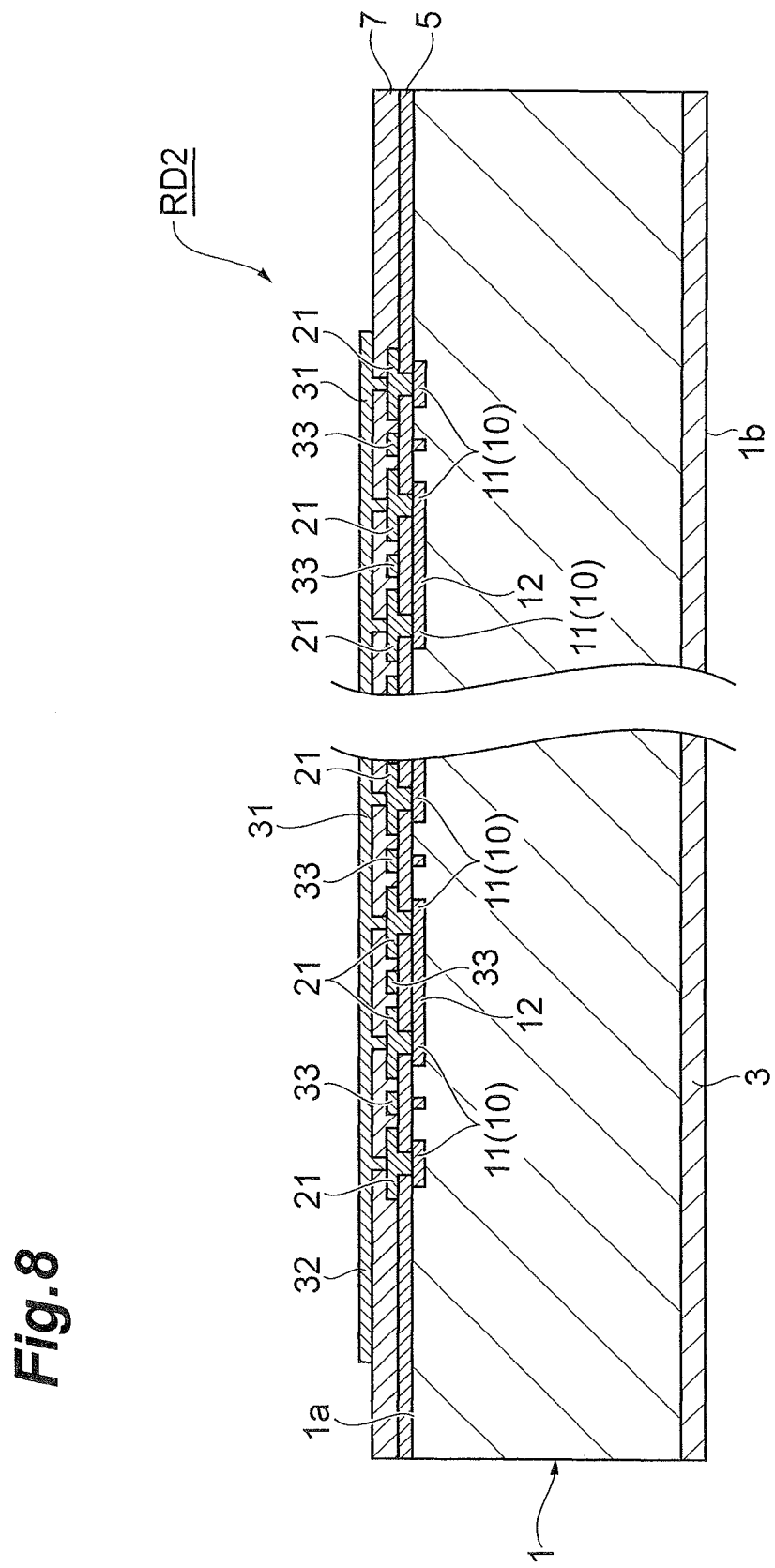
FIG. 8 is a drawing for explaining a sectional configuration along the line VIII-VIII in FIG. 7.
Figure 9:
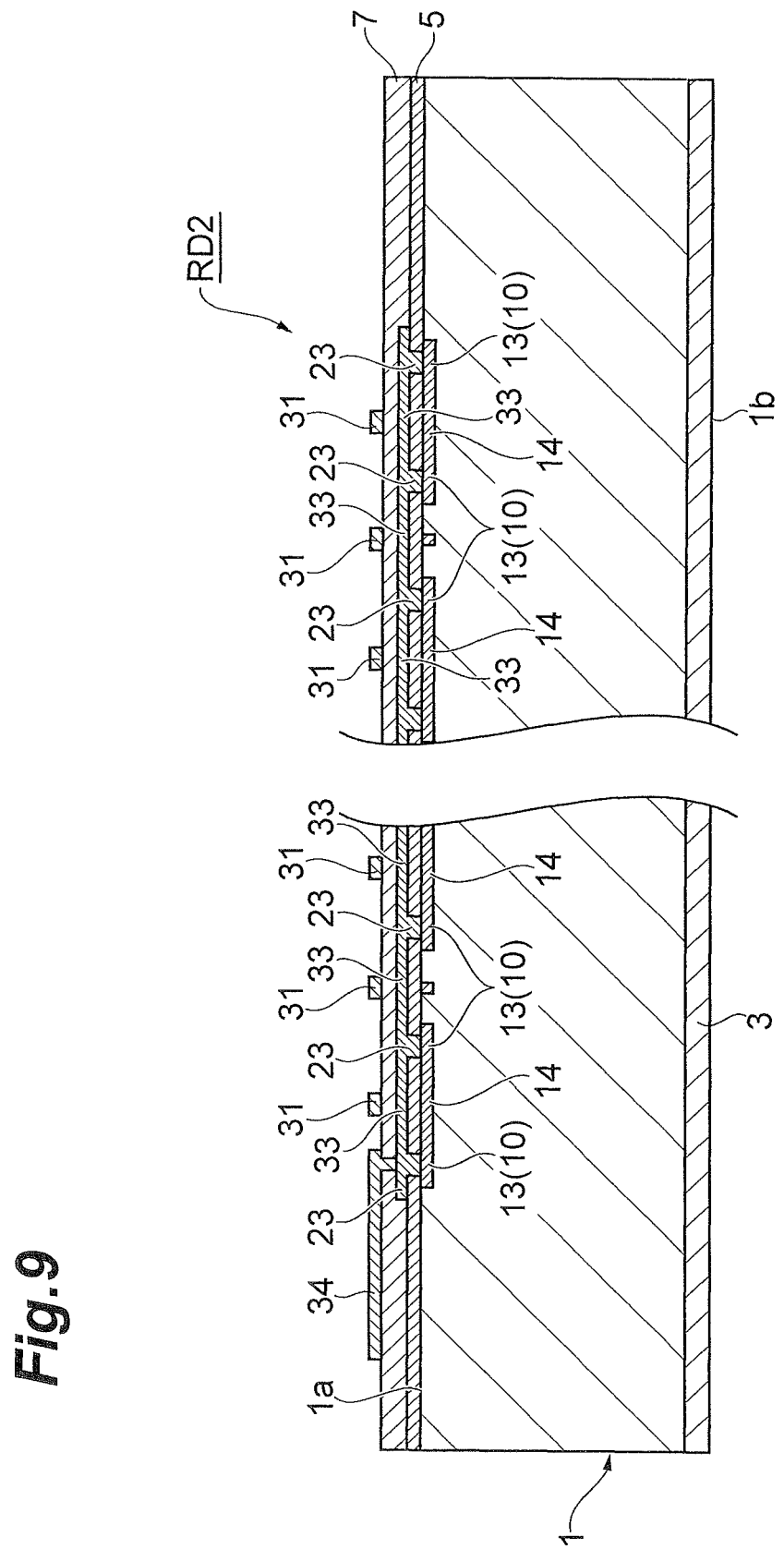
FIG. 9 is a drawing for explaining a sectional configuration along the line IX-IX in FIG. 7.

A configuration of the radiation detector RD2 according to a modification example of the present embodiment will be described below with reference to FIGS. 7 to 9. FIG. 7 is a plan view showing the radiation detector according to the modification example of the present embodiment. FIG. 8 is a drawing for explaining a sectional configuration along the line VIII-VIII in FIG. 7. FIG. 9 is a drawing for explaining a sectional configuration along the line IX-IX in FIG. 7.

The radiation detector RD2, just like the radiation detector RD1, has the semiconductor substrate 1, the plurality of semiconductor regions 10 (the plurality of first semiconductor regions 11 and the plurality of second semiconductor regions 13), the plurality of electrodes 21, 23, the plurality of first interconnections 31, and the plurality of second interconnections 33.

In the radiation detector RD2, the first semiconductor regions 11 adjacent in the first direction are coupled to each other by a semiconductor region 12. Each semiconductor region 12 is a semiconductor region of the second conductivity type with a high impurity concentration (e.g., $p^+$ type), which is the same as the first semiconductor region 11. Each semiconductor region 12 extends in the first direction. Each semiconductor region 12 is formed by diffusing a p-type impurity in a high concentration from the first principal face 1a side in the semiconductor substrate 1.

Each semiconductor region 12 has the width in the second direction set smaller than the width (diameter) in the second direction of the first semiconductor regions 11. The width in the second direction of each semiconductor region 12 is set smaller than the width in the second direction of the first interconnection 31. The semiconductor regions 12 are covered by the first interconnections 31, when viewed from the direction perpendicular to the first principal face 1a. The width in the second direction of the semiconductor regions 12 is, for example, from 3 to 15 μm. The thickness and impurity concentration of the semiconductor regions 12 can be set to be the same as those of the first semiconductor regions 11.

Since in the radiation detector RD2 the first semiconductor regions 11 adjacent in the first direction are coupled to each other by the semiconductor region 12, the first semiconductor regions 11 adjacent in the first direction and the semiconductor region 12 function as one semiconductor region. Namely, this one semiconductor region has a first part (first semiconductor region 11) and a second part (first semiconductor region 11) of the circular shape when viewed from the direction perpendicular to the first principal face 1a, and a third part (semiconductor region 12) extending in the first direction so as to couple the first part and the second part together.

In the radiation detector RD2, the second semiconductor regions 13 adjacent in the second direction are coupled to each other by a semiconductor region 14. Each semiconductor region 14 is a semiconductor region of the second conductivity type with a high impurity concentration (e.g., $p^+$ type), which is the same as the second semiconductor region 13. Each semiconductor region 14 extends in the second direction. Each semiconductor region 14 is formed by diffusing a p-type impurity in a high concentration from the first principal face 1a side in the semiconductor substrate 1.

Each semiconductor region 14 has the width in the first direction set smaller than the width (diameter) in the first direction of the second semiconductor region 13. The width in the first direction of each semiconductor region 14 is set smaller than the width in the first direction of the second interconnection 33. The semiconductor regions 14 are covered by the second interconnections 33, when viewed from the direction perpendicular to the first principal face 1a. The width in the first direction of the semiconductor regions 14 is, for example, from 3 to 15 μm. The thickness and impurity concentration of the semiconductor regions 14 can be set to be the same as those of the second semiconductor regions 13.

Since in the radiation detector RD2 the second semiconductor regions 13 adjacent in the second direction are coupled to each other by the semiconductor region 14, the second semiconductor regions 13 adjacent in the second direction and the semiconductor region 14 function as one semiconductor region. Namely, this one semiconductor region has a first part (second semiconductor region 13) and a second part (second semiconductor region 13) of the circular shape when viewed from the direction perpendicular to the first principal face 1a, and a third part (semiconductor region 14) extending in the second direction so as to couple the first part and the second part together.

In the present modification example as well, as described above, the carriers flowing into the first semiconductor region 11 in the vicinity of their generation position are fed in the first direction and the carriers flowing into the second semiconductor region 13 in the vicinity of the generation position are fed in the second direction. For this reason, the radiation detector RD2 can two-dimensionally detect the incident position of radiation.

In the radiation detector RD2, just as in the radiation detector RD1, the concentration of the electric field is also relieved in the junction region between the semiconductor substrate 1 and each semiconductor region 11, 13, and thus the carriers are prevented from leaking at the junction interface. In the present modification example, the radiation detector RD2 is also improved in response property.

In the radiation detector RD2, when the reverse bias voltage is applied, the depletion layer expands towards the second principal face 1b, not only from the first and second semiconductor regions 11, 13 but also from the semiconductor regions 12, 14. This allows the depletion layer with a sufficient thickness to be formed on a stable basis.

In the radiation detector RD2, the semiconductor regions consisting of the first semiconductor regions 11 adjacent in the first direction and the semiconductor regions 12 and the semiconductor regions consisting of the second semiconductor regions 13 adjacent in the second direction and the semiconductor regions 14 are alternately arrayed in each of the first direction and the second direction. This achieves further reduction in pitches of the arrays of the semiconductor regions consisting of the first semiconductor regions 11 adjacent in the first direction and the semiconductor regions 12 and the semiconductor regions consisting of the second semiconductor regions 13 adjacent in the second direction and the semiconductor regions 14.

Figure 10:
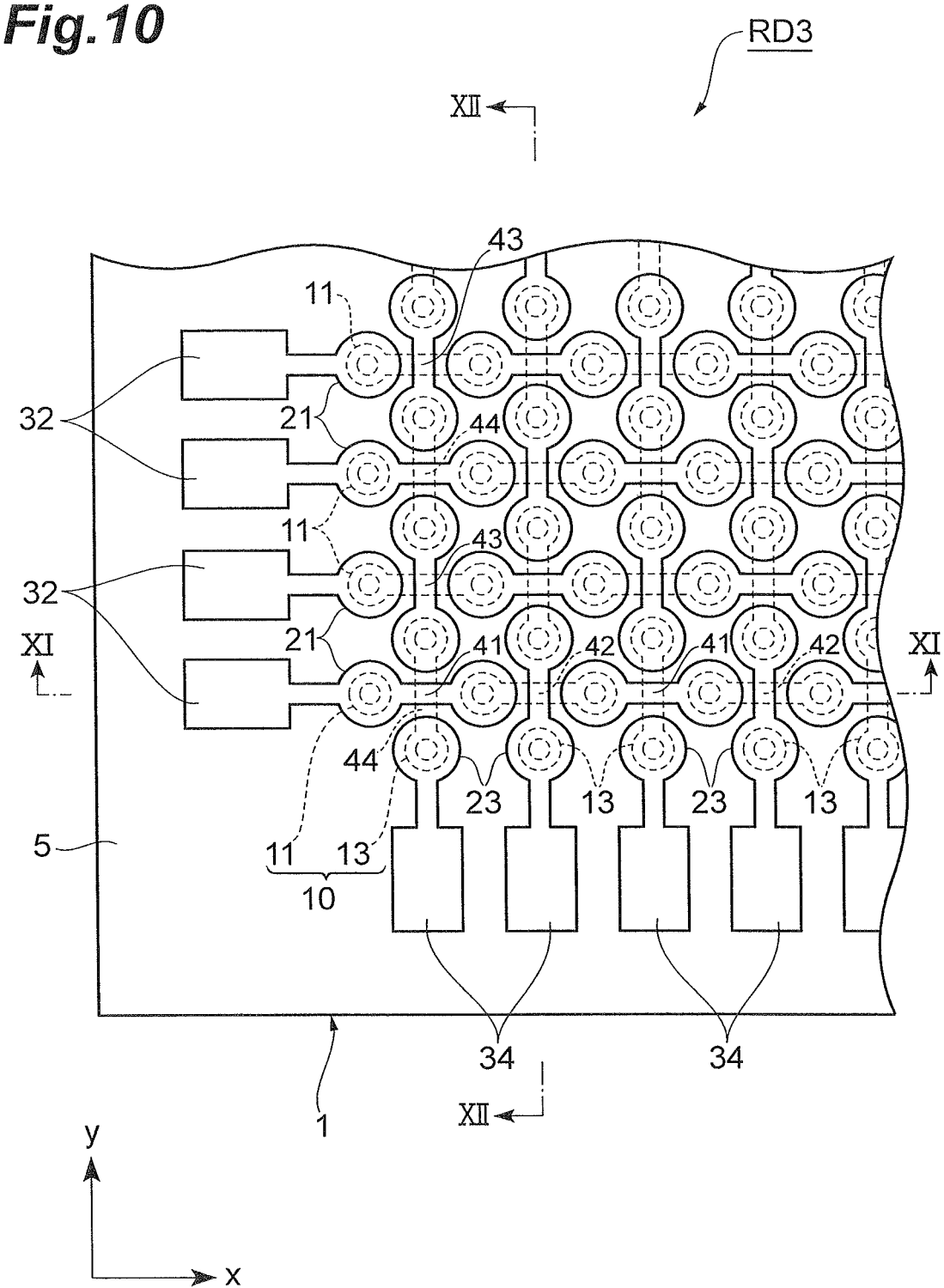
FIG. 10 is a plan view showing the radiation detector according to a modification example of the present embodiment.
Figure 11:
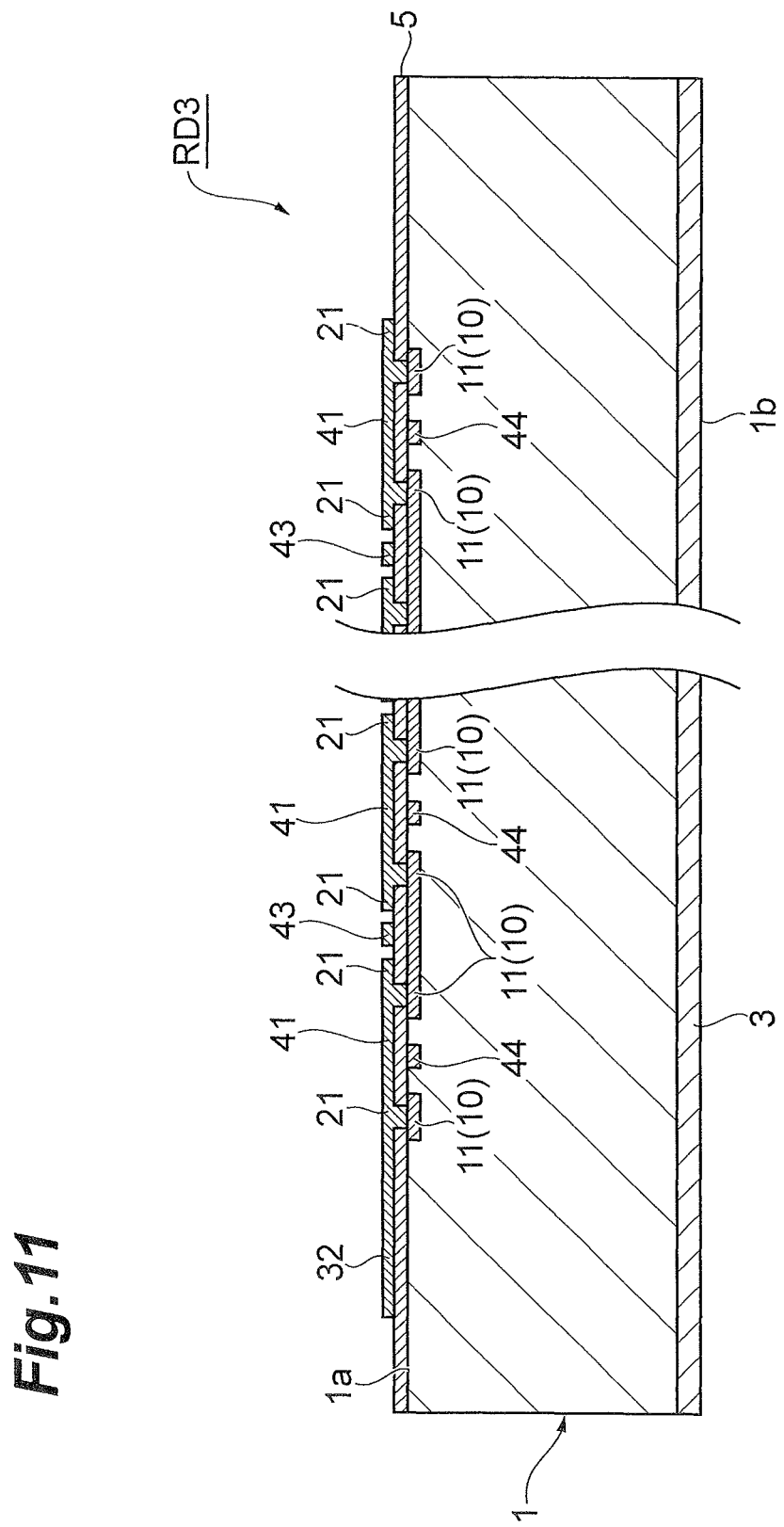
FIG. 11 is a drawing for explaining a sectional configuration along the line XI-XI in FIG. 10.

A configuration of the radiation detector RD3 according to a modification example of the present embodiment will be described below with reference to FIGS. 10 to 12. FIG. 10 is a plan view showing the radiation detector according to the modification example of the present embodiment. FIG. 11 is a drawing for explaining a sectional configuration along the line XI-XI in FIG. 10. FIG. 12 is a drawing for explaining a sectional configuration along the line XII-XII in FIG. 10.

The radiation detector RD3, just like the radiation detector RD1, has the semiconductor substrate 1, the plurality of semiconductor regions 10 (the plurality of first semiconductor regions 11 and the plurality of second semiconductor regions 13), and the plurality of electrodes 21, 23.

The first semiconductor regions 11 arrayed in the first direction out of the plurality of first semiconductor regions 11 are electrically connected by alternately making electric connection through interconnection 41 and electric connection through semiconductor region 42. Namely, the first semiconductor regions 11 arrayed in the first direction are electrically connected to each other through the electrodes 21, interconnections 41, and semiconductor regions 42.

The interconnection 41 extends in the first direction between adjacent electrodes 23 and is connected to the electrodes 21. The interconnection 41 connects the electrodes 21 joined to the first semiconductor regions 11 arrayed in the first direction. Each interconnection 41 is comprised of metal (e.g., aluminum or the like). The interconnection 41 is formed integrally with the electrodes 21. The interconnection 41 has the width in the second direction set smaller than the width (diameter) in the second direction of the first semiconductor regions 11.

The semiconductor region 42 extends in the first direction between adjacent second semiconductor regions 13 to couple the first semiconductor regions 11 together. The semiconductor region 42 is a semiconductor region of the second conductivity type with a high impurity concentration (e.g., $p^+$ type), which is the same as the first semiconductor regions 11. Each semiconductor region 42 is formed by diffusing a p-type impurity in a high concentration from the first principal face 1a side in the semiconductor substrate 1. Each semiconductor region 42 has the width in the second direction set smaller than the width (diameter) in the second direction of the first semiconductor regions 11. The thickness and impurity concentration of the semiconductor regions 42 can be set to be the same as those of the first semiconductor regions 11.

The second semiconductor regions 13 arrayed in the second direction out of the plurality of second semiconductor regions 13 are electrically connected by alternately making electric connection through interconnection 43 and electric connection through semiconductor region 44. Namely, the second semiconductor regions 13 arrayed in the second direction are electrically connected to each other through the electrodes 23, interconnections 43, and semiconductor regions 44.

The interconnection 43 extends in the second direction between adjacent electrodes 21 and is connected to the electrodes 23. The interconnection 43 connects the electrodes 23 joined to the second semiconductor regions 13 arrayed in the second direction. Each interconnection 43 is comprised of metal (e.g., aluminum or the like). The interconnection 43 is formed integrally with the electrodes 23. The interconnection 43 has the width in the first direction set smaller than the width (diameter) in the first direction of the second semiconductor regions 13.

The semiconductor region 44 extends in the second direction between adjacent first semiconductor regions 11 to couple the second semiconductor regions 13 together. The semiconductor region 44 is a semiconductor region of the second conductivity type with a high impurity concentration (e.g., $p^+$ type), which is the same as the second semiconductor regions 13. Each semiconductor region 44 is formed by diffusing a p-type impurity in a high concentration from the first principal face 1a side in the semiconductor substrate 1. Each semiconductor region 44 has the width in the first direction set smaller than the width (diameter) in the first direction of the second semiconductor regions 13. The thickness and impurity concentration of the semiconductor regions 44 can be set to be the same as those of the second semiconductor regions 13.

The interconnections 41 and the semiconductor regions 44 intersect in a three-dimensional manner. The interconnections 43 and the semiconductor regions 42 intersect in a three-dimensional manner. In the present modification example as well, the length of electric connection paths for the first semiconductor regions 11 arrayed in the first direction is set approximately equal to the length of electric connection paths for the second semiconductor regions 13 arrayed in the second direction.

In the present modification example as well, as described above, the carriers flowing into the first semiconductor region 11 in the vicinity of their generation position are fed in the first direction and the carriers flowing into the second semiconductor region 13 in the vicinity of the generation position are fed in the second direction. For this reason, the radiation detector RD3 can two-dimensionally detect the incident position of radiation.

In the radiation detector RD3, just as in the radiation detectors RD1, RD2, the concentration of the electric field is also relieved in the junction region between the semiconductor substrate 1 and each semiconductor region 11, 13, and thus the carriers are prevented from leaking at the junction interface.

The preferred embodiments of the present invention were described above and it should be noted that the present invention is not always limited to the above-described embodiments and can be modified in various ways without departing from the spirit and scope of the invention.

The shape of the first and second semiconductor regions 11, 13 does not have to be limited to the aforementioned circular shape but may be another shape (e.g., a polygonal shape or the like). However, the shape of the first and second semiconductor regions 11, 13 is preferably the circular shape, in terms of the withstand voltage property and the reduction in pitch. The number of semiconductor regions 10 (first and second semiconductor regions 11, 13) (the number of rows and the number of columns thereof) is not limited to the aforementioned number.

In the radiation detectors RD1, RD2, RD3 according to the embodiment and the modification examples the conductivity types of p-type and n-type may be interchanged so as to be reverse to those described above.

INDUSTRIAL APPLICABILITY

The present invention is applicable to the radiation detectors for two-dimensionally detecting the incident position of radiation.

REFERENCE SIGNS LIST 1 semiconductor substrate; 1a first principal face; 1b second principal face; 10 semiconductor regions; 11 first semiconductor regions; 12 semiconductor regions; 13 second semiconductor regions; 14 semiconductor regions; 21, 23 electrodes; 31 first interconnections; 33 second interconnections; RD1, RD2, RD3 radiation detectors.

The invention claimed is:

1. A radiation detector comprising:
a semiconductor substrate of a first conductivity type having first and second principal faces opposed to each other and generating carriers in response to incidence of radiation;
a plurality of semiconductor regions of a second conductivity type which are two-dimensionally arrayed on the first principal face side of the semiconductor substrate, which make junctions with the semiconductor substrate, and into which carriers generated into the semiconductor substrate flow;
a plurality of electrodes arranged corresponding to the respective semiconductor regions of the second conductivity type on the first principal face side of the semiconductor substrate and joined to the corresponding semiconductor regions of the second conductivity type;
a plurality of first interconnections extending in the first direction and connecting the electrodes joined to the first semiconductor regions, to each other; and
a plurality of second interconnections extending in the second direction and connecting the electrodes joined to the second semiconductor regions, to each other,
wherein, when viewed from a direction perpendicular to the first principal face, the plurality of electrodes cover the respective semiconductor regions of the second conductivity type so that outer edges thereof are located outside outer edges of the corresponding semiconductor regions of the second conductivity type,
wherein the plurality of semiconductor regions of the second conductivity type include a plurality of first semiconductor regions in a two-dimensional array and a plurality of second semiconductor regions in a two-dimensional array,
wherein the first semiconductor regions arrayed in a first direction in the two-dimensional array out of the plurality of first semiconductor regions are electrically connected to each other through the first interconnection,
wherein the second semiconductor regions arrayed in a second direction intersecting with the first direction out of the plurality of second semiconductor regions are electrically connected to each other through the second interconnection,
wherein each section of the first interconnections connecting the electrodes adjacent in the first direction has a linear shape to linearly extend between the electrodes adjacent in the first direction, and wherein each section of the second interconnections connecting the electrodes adjacent in the second direction has a linear shape to linearly extend between the electrodes adjacent in the second direction.

2. The radiation detector according to claim 1,
wherein the plurality of first interconnections have a width in the second direction smaller than a width in the second direction of the first semiconductor regions, and
wherein the plurality of second interconnections have a width in the first direction smaller than a width in the first direction of the second semiconductor regions.

3. The radiation detector according to claim 1,
wherein central portions of regions where the first semiconductor regions and the electrodes are joined are included in regions where the first interconnections extend in the first direction, and
wherein central portions of regions where the second semiconductor regions and the electrodes are joined are included in regions where the second interconnections extend in the second direction.

4. The radiation detector according to claim 1,
wherein the electrodes joined to the first semiconductor regions, the electrodes joined to the second semiconductor regions, and the second interconnections are located in a first layer,
wherein the first interconnections are located in a second layer different from the first layer, and
wherein the first interconnections and the second interconnections intersect in a three-dimensional manner.

5. The radiation detector according to claim 1,
wherein the first semiconductor regions and the second semiconductor regions have a circular shape when viewed from the direction perpendicular to the first principal face.

6. The radiation detector according to claim 1,
wherein the first semiconductor regions and the second semiconductor regions are alternately arrayed in a third direction intersecting with the first direction and the second direction.

7. The radiation detector according to claim 1,
wherein the plurality of first semiconductor regions have first and second parts of a circular shape when viewed from the direction perpendicular to the first principal face, and a third part extending in the first direction so as to couple the first part and the second part together, and
wherein the plurality of second semiconductor regions have first and second parts of a circular shape when viewed from the direction perpendicular to the first principal face, and a third part extending in the second direction so as to couple the first part and the second part together.

8. The radiation detector according to claim 7,
wherein the first semiconductor regions and the second semiconductor regions are alternately arrayed in each of the first direction and the second direction.

* * * * *